(12) United States Patent
Lee

(10) Patent No.: US 7,427,561 B2
(45) Date of Patent: Sep. 23, 2008

(54) METHOD FOR MANUFACTURING SEMICONDUCTOR DEVICE

(75) Inventor: Han Choon Lee, Seoul (KR)

(73) Assignee: Dongbuanam Semiconductor, Inc., Seoul (KR)

( * ) Notice: Subject to any disclaimer, the term of this patent is extended or adjusted under 35 U.S.C. 154(b) by 240 days.

(21) Appl. No.: 11/293,081

(22) Filed: Dec. 5, 2005

(65) Prior Publication Data
US 2006/0141723 A1    Jun. 29, 2006

(30) Foreign Application Priority Data
Dec. 29, 2004  (KR) .................. 10-2004-0114860

(51) Int. Cl.
*H01L 21/00* (2006.01)
*H01L 21/44* (2006.01)
(52) U.S. Cl. .................. 438/627; 438/622; 438/628; 438/643; 438/653; 438/687; 257/E21.304; 257/E21.311; 257/E21.576; 257/E21.582; 257/E21.583
(58) Field of Classification Search .................. 438/300, 438/585, 622, 627, 628, 631, 643, 653, 687, 438/758, 798, 799; 257/E21.623, E21, 122, 257/E21.304, E21.311, E21.576, E21.582, 257/E21.583
See application file for complete search history.

(56) References Cited

U.S. PATENT DOCUMENTS

| 5,741,725 | A  | * | 4/1998  | Inoue et al. ................. 438/664 |
| 6,797,609 | B2 | * | 9/2004  | Noguchi et al. ............. 438/627 |
| 6,838,381 | B2 | * | 1/2005  | Hsu et al. .................... 438/682 |
| 2005/0139934 | A1 | * | 6/2005  | Lee et al. ..................... 257/382 |
| 2006/0228897 | A1 | * | 10/2006 | Timans ........................ 438/758 |

FOREIGN PATENT DOCUMENTS

KR    1020030001038    6/2001

* cited by examiner

*Primary Examiner*—Michael S Lebentritt
(74) *Attorney, Agent, or Firm*—McKenna Long & Aldridge LLP

(57) ABSTRACT

A semiconductor device manufacturing method wherein a metal suicide layer is formed via an in-situ process. The method includes forming a gate electrode on a semiconductor substrate; forming an insulation side wall at either lateral surface of the gate electrode; forming a source/drain region in a surface of the semiconductor substrate at either side of the gate electrode; forming a metal layer on the surface of the semiconductor substrate including the gate electrode; performing a plasma treatment on the metal layer; forming a capping material layer on the metal layer; performing an annealing process upon the semiconductor substrate, to form a metal silicide layer on the surface of the semiconductor substrate at positions corresponding to the gate electrode and the source/drain region; and removing the capping material layer and the metal layer remained without reaction with the gate electrode and the semiconductor substrate.

5 Claims, 7 Drawing Sheets

METHOD FOR MANUFACTURING SEMICONDUCTOR DEVICE

CROSS REFERENCE TO RELATED APPLICATIONS

This application claims the benefit of Korean Patent Application No. 10-2004-0114860, filed on Dec. 29, 2004, which is hereby incorporated by reference as if fully set forth herein.

BACKGROUND OF THE INVENTION

1. Field of the Invention

The present invention relates to a semiconductor device and manufacturing method, and more particularly, to a semiconductor device manufacturing method in which a metal silicide layer is formed via an in-situ process, resulting in a simplified overall manufacturing process.

2. Discussion of the Related Art

With the reduction in the geometrical size of semiconductor devices, the areas of gate and source/drain regions are decreasing. Along with this reduction in size, there is a need to reduce the bonding thickness of source/drain regions and the resulting high-resistance regions. To substantially lower resistance in the source/drain regions metal silicides are used for the electrical contacts between those regions, and adjacent polysilicon regions. Such silicides, which may be of platinum, manganese, cobalt, or titanium, are formed wherever the source/drain regions are to come into contact with exposed polysilicon regions by depositing and then heating a thin metal layer having a high fusion point. Such a method for forming a metal silicide layer according to a related art is shown in FIGS. 1A-1F.

Referring to FIG. 1A, a semiconductor substrate 21 is divided into an active region and a device separating region, and a device isolation layer 22 is formed on the semiconductor substrate 21 at the device separating region by use of a local oxidation of silicon (LOCOS) or shallow trench isolation (STI) process. Next, the semiconductor substrate 21 is thermally oxidized at a high-temperature so that a gate oxide layer 23 is formed on the semiconductor substrate 21.

Referring to FIG. 1B, a poly-silicon layer is deposited on the gate oxide layer 23, and is selectively etched via a photo-etching process to form a gate electrode 24. Then, low-density impurity ions are implanted into a surface of the semiconductor substrate 21 at opposite sides of the gate electrode 24 to form a lightly doped drain (LDD) region 25.

Referring to FIG. 1C, an insulation layer is deposited on the surface of the semiconductor substrate 21. Subsequently, the insulation layer is subjected to an etch-back process so that an insulation sidewall 26 is formed at either lateral surface of the gate electrode 24. Then, high-density impurity ions are implanted into the surface of the semiconductor substrate 21 to form a source/drain impurity region 27 by using the gate electrode 24 and the insulation sidewall 26 as a mask.

Referring to FIG. 1D, the semiconductor substrate 21 is subjected to a washing process for removing various objects, such as metal impurities, organic pollutants, natural oxides, etc. Conventionally, the washing process is a chemical washing process using a standard cleaning 1 (SC1) solution and hydrofluoric (HF) or dilute hydrofluoric (DHF) solution. Here, the SC1 solution is an organic matter having a mixing ratio of $NH_4OH:H_2O_2:H_2O$ of 1:4:20.

After completing the washing process, the semiconductor substrate 21 is transferred into a sputtering chamber (not shown) of a sputtering apparatus so that a metal layer 28, such as a nickel layer, is formed on the surface of the semiconductor substrate 21 via a sputtering process.

Referring to FIG. 1E, the semiconductor substrate 21 is heat treated at a temperature of 400° C. to 600° C. in a specific apparatus, for example, a rapid thermal process apparatus or an electric furnace. As a result, a metal silicide layer 29 is formed on the surface of the semiconductor substrate 21 at positions corresponding to the gate electrode 24 and the source/drain impurity region 27. The metal silicide layer 29 is obtained as metal ions of the metal layer 28 react with silicon ions of the semiconductor substrate 21 and gate electrode 24 during the heat treatment. The metal layer 28 remains on the insulation sidewall 26 and device isolation layer 22 without reacting.

Referring to FIG. 1F, after removing the non-reacted metal layer 28, which is not used to form the metal silicide layer 29, the semiconductor substrate 21 is subjected to an annealing process at a predetermined temperature. This annealing process stabilizes the phase of the metal silicide layer 29, thereby achieving the low-resistance metal silicide layer 29.

According to the method for forming a metal silicide layer as described above, however, it is necessary to transfer the semiconductor substrate with the deposited metal layer to the specific heating apparatus for the heat treatment necessary to form the metal suicide layer. Such additional heat treatment makes the overall manufacture more complex, it requires an additional apparatus, and it increases the cycling time of the lot in progress.

SUMMARY OF THE INVENTION

Accordingly, the present invention is directed to a method for manufacturing a semiconductor device that substantially obviates one or more problems due to limitations and disadvantages of the related art.

An advantage of the present invention is that it provides a semiconductor device manufacturing method in which a metal suicide layer is formed via an in-situ process in the same chamber, resulting in a simplified overall manufacturing process.

Additional advantages, and features of the invention will be set forth in part in the description which follows and in part will become apparent to those having ordinary skill in the art upon examination of the following or may be learned from practice of the invention.

To achieve these and other advantages in accordance with the purpose of the invention, as embodied and broadly described herein, a method for manufacturing a semiconductor device comprises forming a gate electrode on a semiconductor substrate by interposing a gate insulation layer; forming an insulation side wall at either lateral surface of the gate electrode; forming a source/drain region in a surface of the semiconductor substrate at either side of the gate electrode; forming a metal layer on the surface of the semiconductor substrate including the gate electrode; performing a plasma treatment on the metal layer; forming a capping material layer on the metal layer; performing an annealing process upon the semiconductor substrate to form a metal silicide layer on the surface of the semiconductor substrate at positions corresponding to the gate electrode and the source/drain region; and removing the capping material layer and the metal layer remained without reaction with the gate electrode and the semiconductor substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiment(s) of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings. Wherever possible, like reference designations will be used throughout the drawings to refer to the same or similar parts.

FIGS. 2A-2H illustrate a semiconductor device manufacturing method according to an exemplary embodiment of the present invention.

Figure 1A:
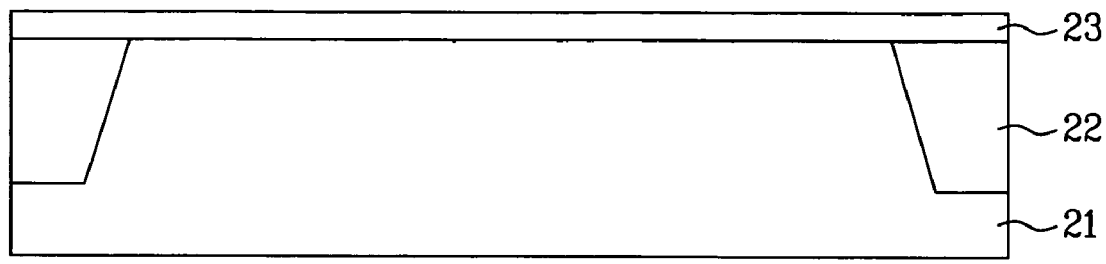
FIGS. 1A-1F are sectional views respectively illustrating sequential processes of a semiconductor device manufacturing method according to the prior art.
Figure 1B:
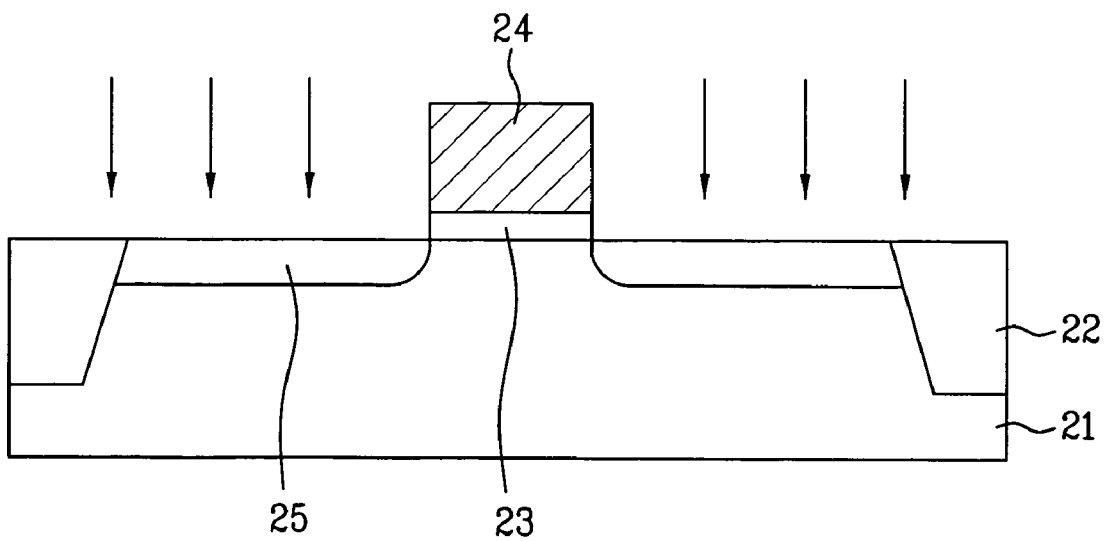
Figure 1C:
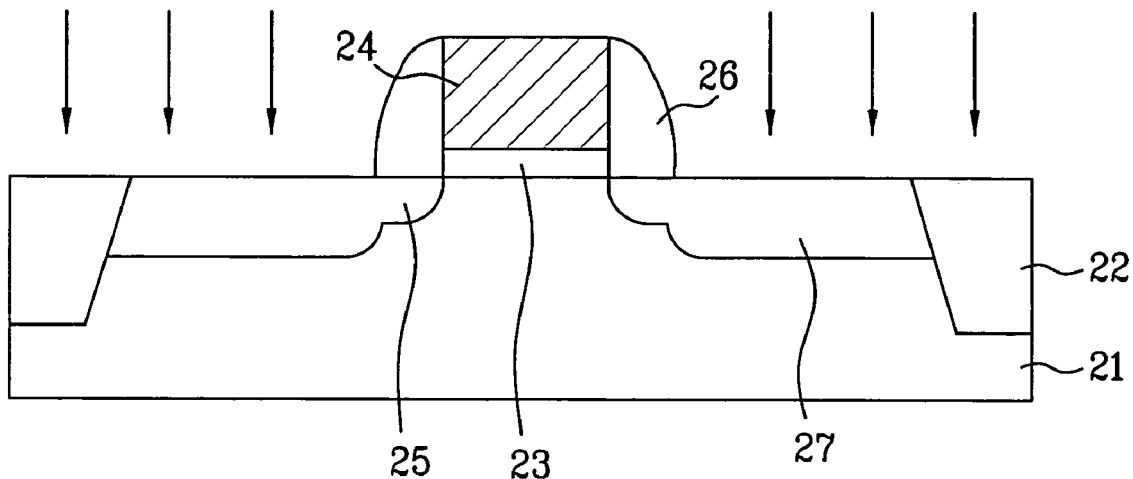
Figure 1D:
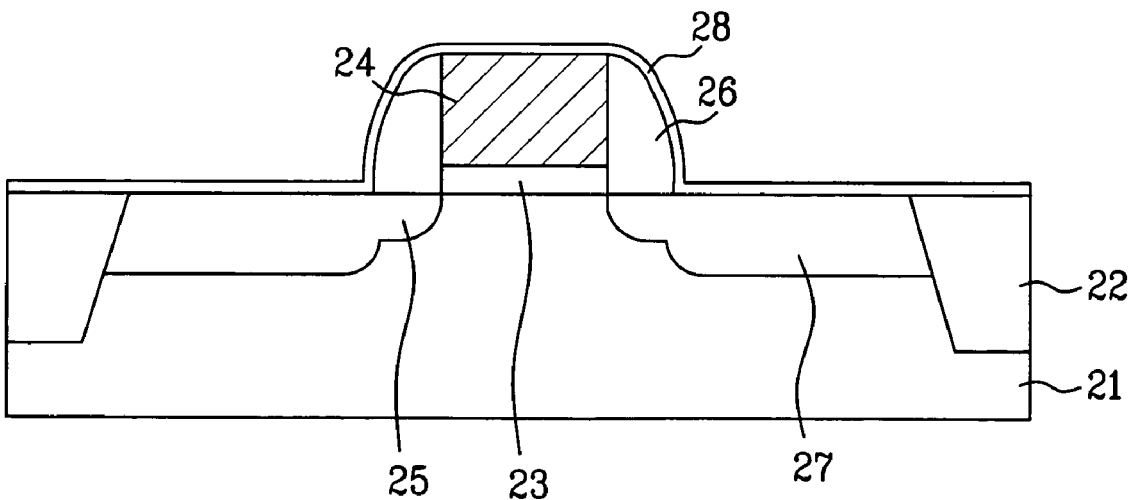
Figure 1E:
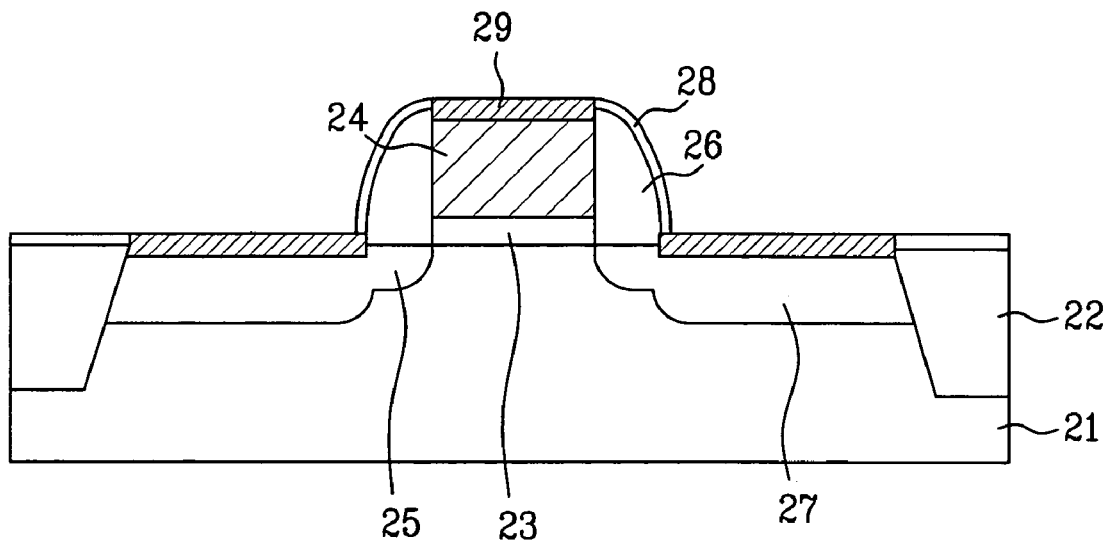
Figure 1F:
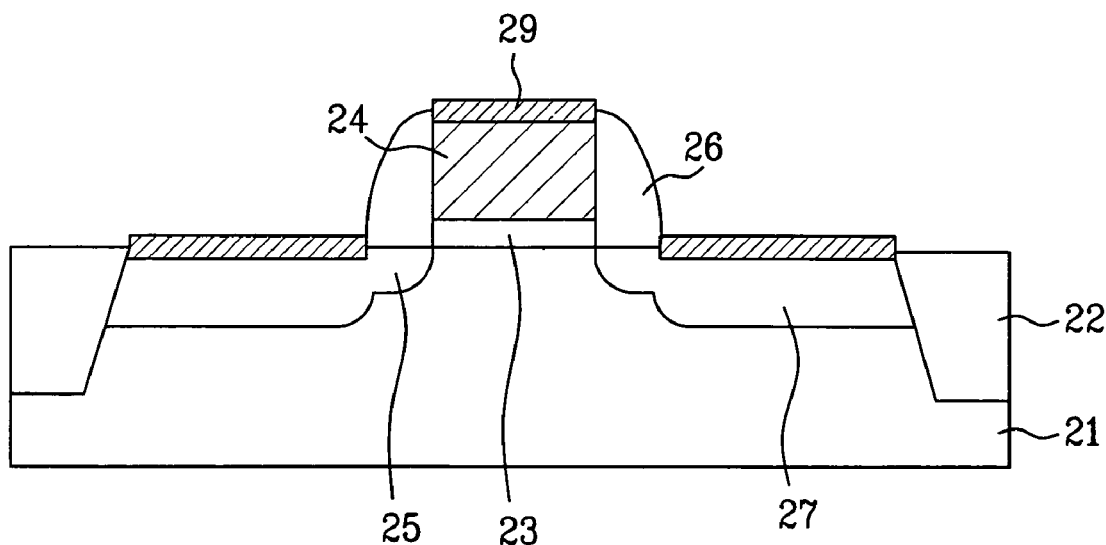
Figure 2A:
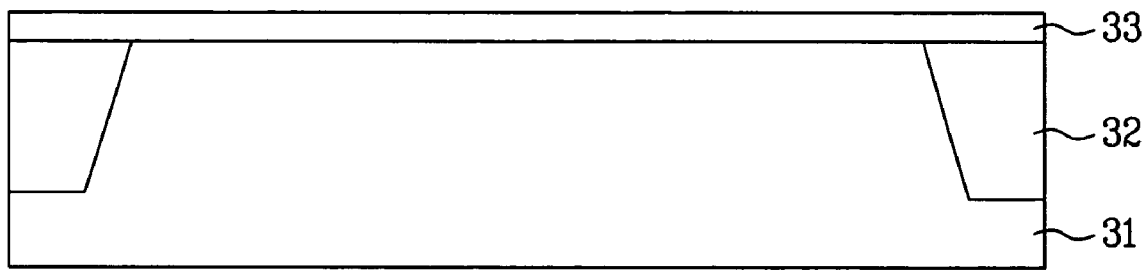
FIGS. 2A-2H are sectional views respectively illustrating sequential processes of a semiconductor device manufacturing method according to an exemplary embodiment of the present invention.

Referring to FIG. 2A, a semiconductor substrate 31 is divided into an active region and a device separating region, and a device isolation layer 32 is formed on the semiconductor substrate 31 at the device separating region by use of a LOCOS or STI process. Subsequently, the semiconductor substrate 31 is thermally oxidized at a high-temperature so that a gate oxide layer 33 is formed on the semiconductor substrate 31.

Figure 2B:
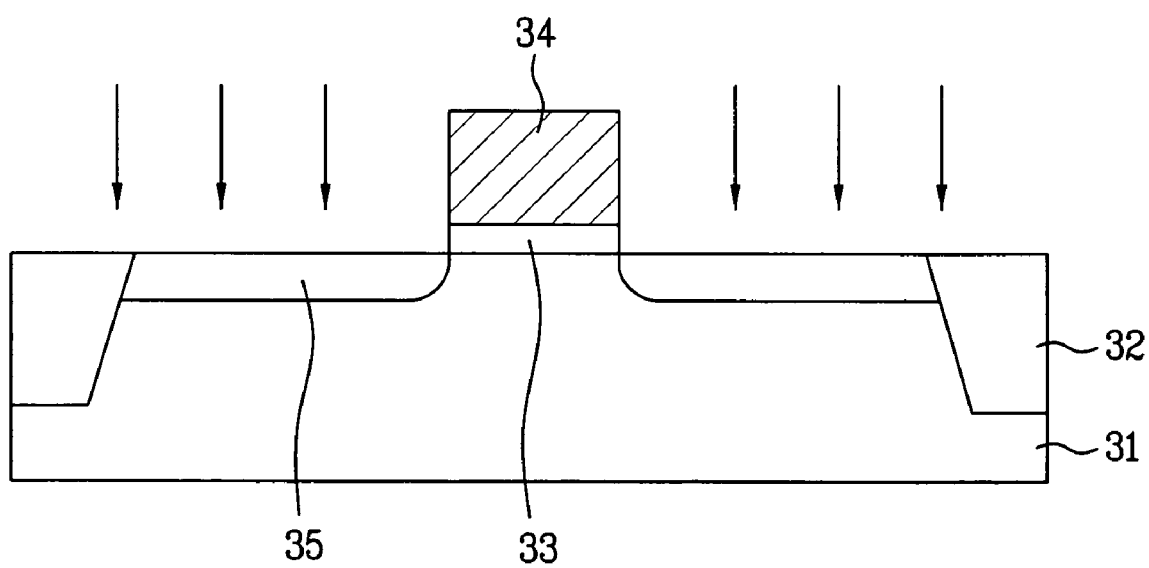

Referring to FIG. 2B, a poly-silicon layer is deposited on the gate oxide layer 33, and is selectively etched via a photo-etching process to form a gate electrode 34. Subsequently, low-density impurity ions are implanted into a surface of the semiconductor substrate 31 at opposite sides of the gate electrode 34 to form a lightly doped drain (LDD) region 35.

Figure 2C:
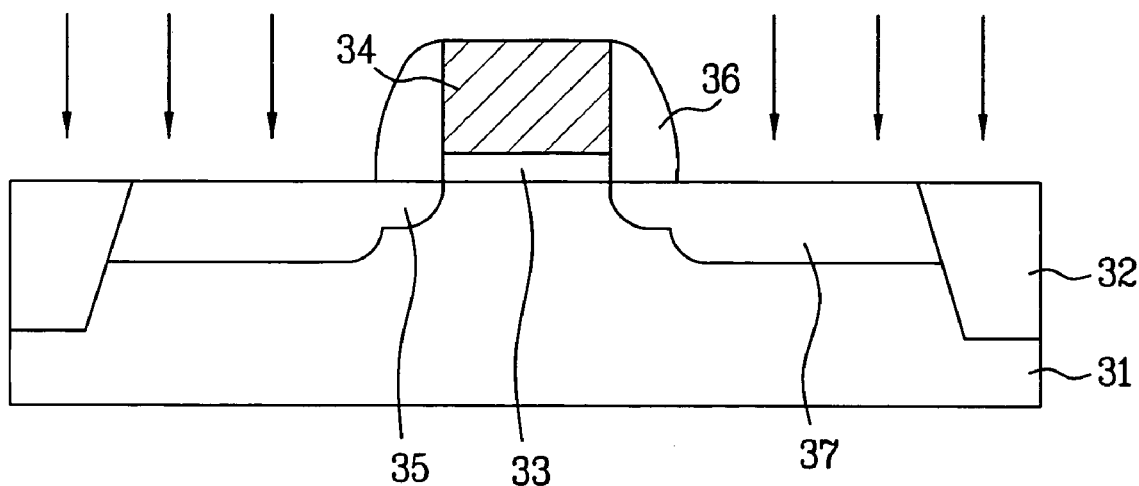

Referring to FIG. 2C, an insulation layer is deposited on the surface of the semiconductor substrate 31. Subsequently, the insulation layer is subjected to an etch-back process so that an insulation sidewall 36 is formed at either lateral surface of the gate electrode 34. High-density impurity ions are then implanted into the surface of the semiconductor substrate 31 to form a source/drain impurity region 37 by using the gate electrode 34 and the insulation sidewall 36 as a mask.

Figure 2D:
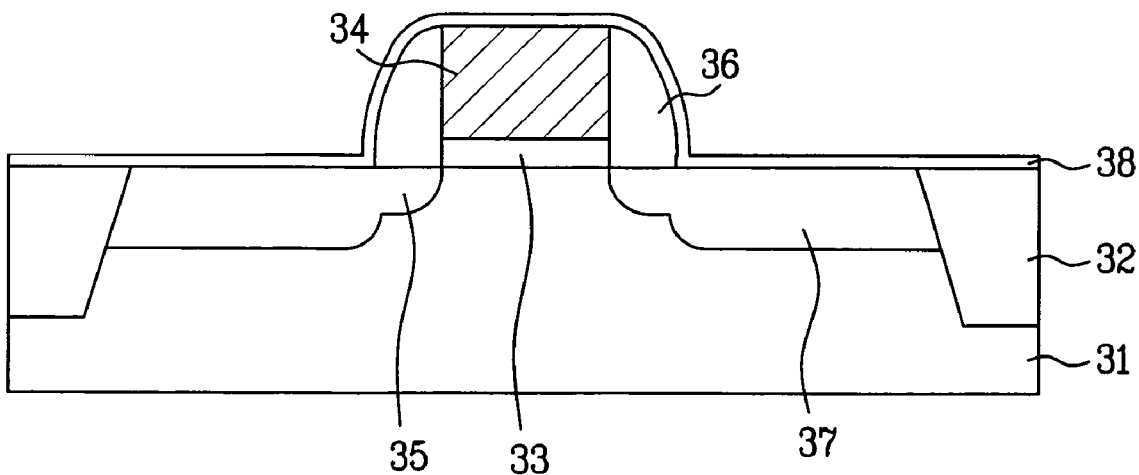

Referring to FIG. 2D, the semiconductor substrate 31 is subjected to a washing process for removing various objects, such as metal impurities, organic pollutants, natural oxides, etc. The washing process may be a chemical washing process using a standard cleaning 1 (SC1) solution and hydrofluoric (HF) or dilute hydrofluoric (DHF) solution. An exemplary SC1 solution may be an organic matter having a mixing ratio of $NH_4OH:H_2O_2:H_2O$ of 1:4:20. After completing the washing process, the semiconductor substrate 31 is transferred into a chamber (not shown) of a specific apparatus, for example, a physical vapor deposition apparatus or a chemical vapor deposition apparatus so that a metal layer 38, such as a nickel layer, is formed on the surface of the semiconductor substrate 31.

Other metals having a high fusion point, such as cobalt, titanium, tungsten, tantalum, and molybdenum, may be substituted for nickel.

Figure 2E:
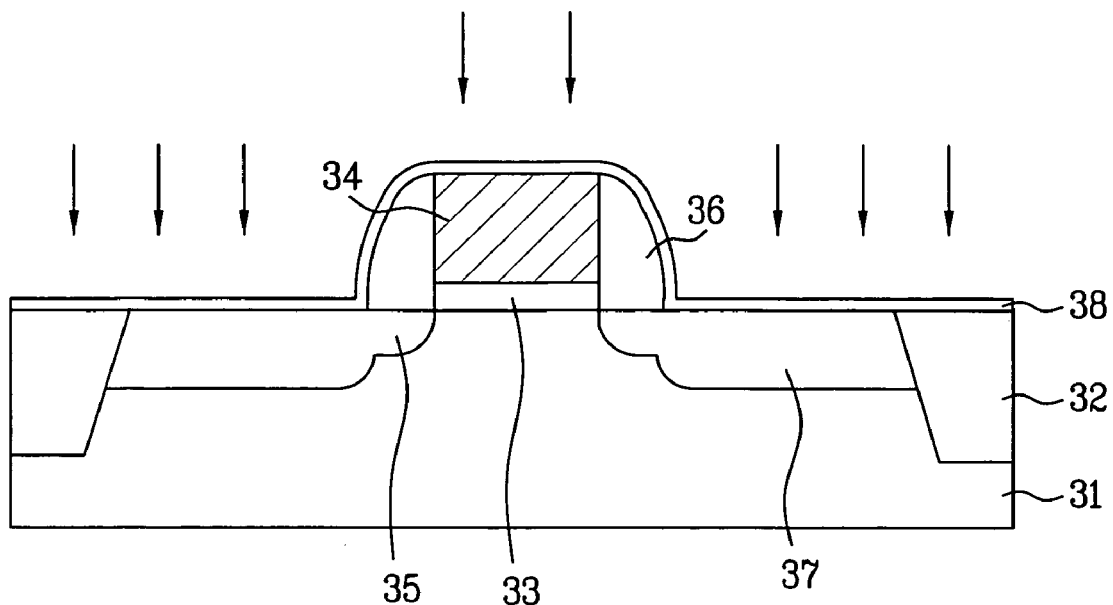

Referring to FIG. 2E, the metal layer 38 is subjected to a plasma surface treatment using nitrogen ($N_2$) or ammonia ($NH_3$) gas. The plasma surface treatment using nitrogen ($N_2$) or ammonia ($NH_3$) gas is carried out in the same chamber that is used to form the metal layer 38.

Figure 2F:
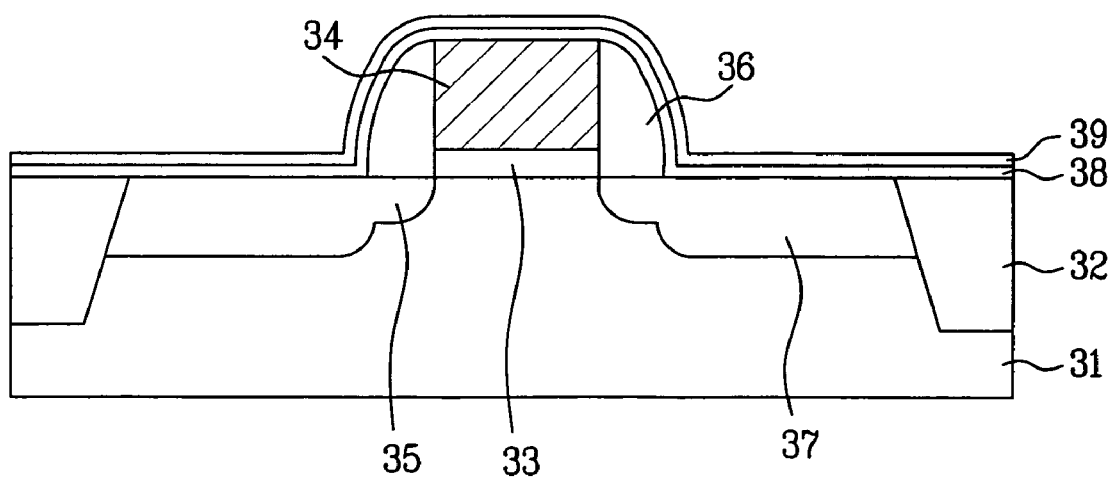

Referring to FIG. 2F, after completing the plasma surface treatment using nitrogen ($N_2$) or ammonia ($NH_3$) gas, a capping material layer 39 is formed on the metal layer 38 using physical vapor deposition or chemical vapor deposition. The capping material layer 39 is formed of any one of a titanium layer, a nitride titanium layer, and a titanium/nitride titanium layer. The capping material layer 39 may also be formed in the same chamber used to form the metal layer 38.

Figure 2G:
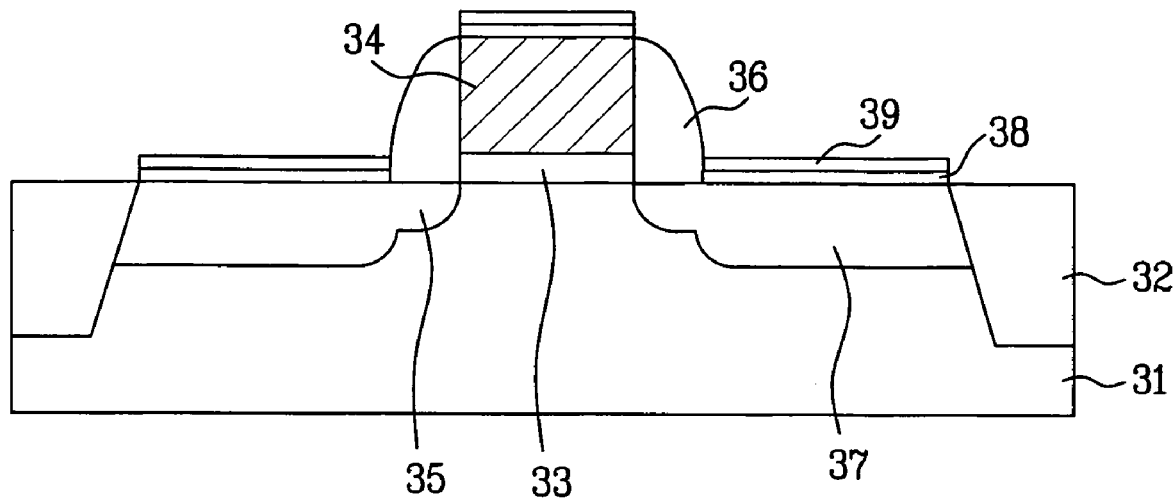

Referring to FIG. 2G, after completing the formation of the capping material layer 39, the semiconductor substrate 31 is subjected to an annealing process under nitrogen ($N_2$) or ammonia ($NH_3$) atmosphere, so that a metal silicide layer 40 is formed on the surface of the semiconductor substrate 31 at positions corresponding to the gate electrode 34 and the source/drain impurity region 37.

The annealing process may be carried out in the same chamber that is used to form the metal layer 38, to perform the plasma surface treatment using nitrogen or ammonia gas, and to form the capping material layer 39.

Figure 2H:
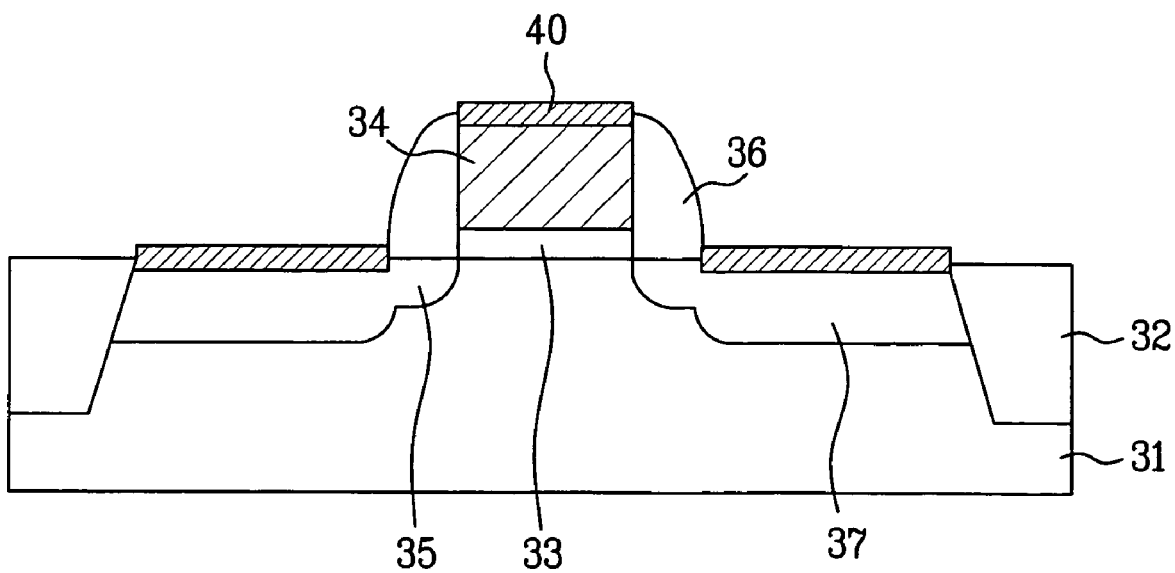

Referring to FIG. 2H, the metal layer 38 that remained unreacted with the semiconductor substrate 31 and the gate electrode 34, and the capping material layer 39 formed thereon, are removed via a wet etching process.

As apparent from the above description, the present invention provides a semiconductor device manufacturing method comprising steps of forming a metal layer via an in-situ process; performing a plasma surface treatment on the metal layer; forming a capping material layer; and performing an annealing process, whereby a metal silicide layer having equivalent or higher properties as compared to the prior art can be obtained without breaking the vacuum.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for manufacturing a semiconductor device, comprising:

forming a gate electrode on a semiconductor substrate by interposing a gate insulation layer;

forming an insulation side wall at either lateral surface of the gate electrode;

forming a source/drain region in a surface of the semiconductor substrate at either side of the gate electrode;

forming a metal layer on the surface of the semiconductor substrate including the gate electrode;

performing a plasma treatment on the metal layer;

forming a capping material layer on the metal layer using one of physical vapor deposition and chemical vapor deposition;

performing an annealing process upon the semiconductor substrate to form a metal silicide layer on the surface of the semiconductor substrate at positions corresponding to the gate electrode and the source/drain region; and removing the capping material layer and the metal layer left unreacted with the gate electrode and the semiconductor substrate;

wherein the forming of the metal layer, the plasma treatment, the forming of the capping material layer, and the annealing process are performed in the same chamber via an in-situ process.

2. The method as set forth in claim 1, wherein the plasma treatment is performed using nitrogen or ammonia gas.

3. The method as set forth in claim 1, wherein the annealing process is performed under nitrogen or ammonia atmosphere.

4. The method as set forth in claim 1, wherein the capping material layer is formed by depositing one of a titanium layer, a nitride titanium layer, and a titanium/nitride titanium layer.

5. The method as set forth in claim 1, wherein the metal layer is selected from the group consisting of a nickel layer, a cobalt layer, a titanium layer, a tungsten layer, a tantalum layer, and a molybdenum layer.

* * * * *